United States Patent
Chen et al.

(10) Patent No.: US 10,438,893 B2
(45) Date of Patent: Oct. 8, 2019

(54) METAL INTERCONNECT STRUCTURE AND METHOD FOR FABRICATING THE SAME

(71) Applicant: UNITED MICROELECTRONICS CORP., Hsin-Chu (TW)

(72) Inventors: Shih-Hsien Chen, Kaohsiung (TW); Meng-Jun Wang, Taichung (TW); Ting-Chun Wang, New Taipei (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/784,180

(22) Filed: Oct. 15, 2017

(65) Prior Publication Data

US 2019/0096819 A1    Mar. 28, 2019

(30) Foreign Application Priority Data

Sep. 22, 2017    (CN) .......................... 2017 1 0867909

(51) Int. Cl.

| H01L 23/532 | (2006.01) |
| H01L 21/768 | (2006.01) |
| H01L 21/311 | (2006.01) |
| H01L 21/02 | (2006.01) |
| H01L 23/528 | (2006.01) |
| H01L 23/522 | (2006.01) |

(52) U.S. Cl.
CPC .. *H01L 23/53295* (2013.01); *H01L 21/02115* (2013.01); *H01L 21/31116* (2013.01); *H01L 21/31144* (2013.01); *H01L 21/7682* (2013.01); *H01L 21/7685* (2013.01); *H01L 21/76828* (2013.01); *H01L 21/76832* (2013.01); *H01L 21/76895* (2013.01); *H01L 23/528* (2013.01); *H01L 23/5222* (2013.01); *H01L 23/53228* (2013.01)

(58) Field of Classification Search
USPC ....................................................... 257/773
See application file for complete search history.

(56) References Cited

U.S. PATENT DOCUMENTS

| 7,928,003 B2 | 4/2011 | Naik |
| 9,691,773 B2 | 6/2017 | Surthi et al. |
| 2009/0079083 A1 | 3/2009 | Yang |
| 2016/0020176 A1* | 1/2016 | Yang ................. H01L 23/53228 257/759 |

(Continued)

OTHER PUBLICATIONS

Liou, Title of Invention: Metal Interconnect Structure and Method for Fabricating the Same, U.S. Appl. No. 14/682,124, filed Apr. 9, 2015.

*Primary Examiner* — Zandra V Smith
*Assistant Examiner* — Lawrence C Tynes, Jr.
(74) *Attorney, Agent, or Firm* — Winston Hsu

(57) ABSTRACT

A method for fabricating semiconductor device includes the steps of: providing a substrate having a first inter-metal dielectric (IMD) layer thereon; forming a first metal interconnection and a second metal interconnection in the first IMD layer; removing part of the first IMD layer to form a recess between the first metal interconnection and the second metal interconnection; performing a curing process; and forming a second IMD layer on the first metal interconnection and the second metal interconnection.

16 Claims, 4 Drawing Sheets

(56) References Cited

U.S. PATENT DOCUMENTS

2016/0111325 A1* 4/2016 JangJian .......... H01L 23/53238
 257/774
2016/0118335 A1* 4/2016 Lee .................. H01L 23/53295
 257/774
2017/0330832 A1* 11/2017 He .................... H01L 23/5222
2017/0358481 A1* 12/2017 Lin ................... H01L 21/76289

* cited by examiner

METAL INTERCONNECT STRUCTURE AND METHOD FOR FABRICATING THE SAME

BACKGROUND OF THE INVENTION

1. Field of the Invention

The invention relates to a method for fabricating metal interconnect structure, and more particularly, to a method of forming air gap within metal interconnect structure.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, how to provide an enhanced metal interconnect structure with air gap structure for resolving the aforementioned issues has become an important task in this field.

SUMMARY OF THE INVENTION

According to an embodiment of the present invention, a method for fabricating semiconductor device includes the steps of: providing a substrate having a first inter-metal dielectric (IMD) layer thereon; forming a first metal interconnection and a second metal interconnection in the first IMD layer; removing part of the first IMD layer to form a recess between the first metal interconnection and the second metal interconnection; performing a curing process; and forming a second IMD layer on the first metal interconnection and the second metal interconnection.

According to another aspect of the present invention, a semiconductor device includes: a substrate having a first inter-metal dielectric (IMD) layer thereon; a first metal interconnection and a second metal interconnection in the first IMD layer; and an air gap between the first metal interconnection and the second metal interconnection. Preferably, a vertex of the air gap is higher than a top surface of the first metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
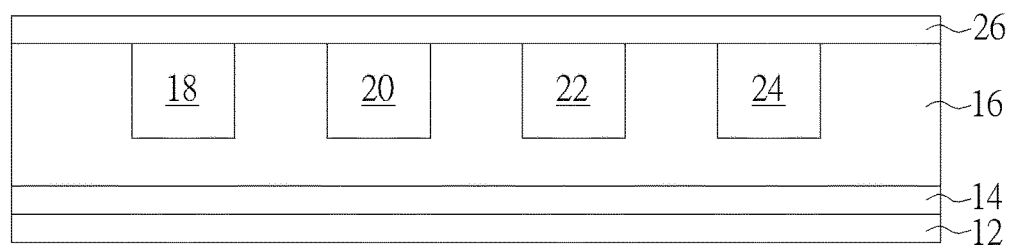
FIGS. 1-7 illustrate a method for fabricating metal interconnect structure according to a preferred embodiment of the present invention.

Referring to FIGS. 1-7, FIGS. 1-7 illustrate a method for fabricating metal interconnect structure according to a preferred embodiment of the present invention. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer 14 could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacer, epitaxial layer, contact etch stop layer (CESL), the ILD layer 14 could be formed on the substrate 12 and covering the MOS transistors, and a plurality of contact plugs could be formed in the ILD layer 14 to electrically connect to the gate and/or source/drain region of MOS transistors. Since the fabrication of planar or non-planar transistors and ILD layer 14 is well known to those skilled in the art, the details of which are not explained herein for the sake of brevity.

Next, metal interconnect structures are formed on the ILD layer 14 to electrically connect to the aforementioned contact plugs, in which the metal interconnect structures preferably include a selective stop layer (not shown) on the ILD layer 14, a first inter-metal dielectric (IMD) layer 16, and a plurality of metal interconnections 18, 20, 22, 24 embedded within the first IMD layer 16, in which the top surfaces of the metal interconnections 18, 20, 22, 24 and the first IMD layer 16 are coplanar. It should be noted that even though four metal interconnections 18, 20, 22, 24 are formed in the first IMD layer 16 in this embodiment, the number of the metal interconnections is not limited to four, but could also be adjusted according to the demand of the product.

Preferably, each of the metal interconnections 18, 20, 22, 24 is composed of a trench conductor. Nevertheless, according to other embodiment of the present invention, each of the metal interconnections 18, 20, 22, 24 could also include a trench conductor, a via conductor, or combination thereof, and each of the metal interconnections 18, 20, 22, 24 are electrically connected to each other and embedded within the first IMD layer 16 and/or stop layer according to dual damascene process. Since dual damascene process is well known to those skilled in the art, the details of which are not explained herein for the sake of brevity. In this embodiment, the metal interconnections 18, 20, 22, 24 is composed of copper, the first IMD layer 16 is composed of silicon oxide, and the stop layer is composed of silicon nitride, but not limited thereto. Next, a first cap layer 26 is formed on the first IMD layer 16 and the metal interconnections 18, 20, 22, 24, in which the first cap layer 26 preferably includes nitrogen doped carbide (NDC), but not limited thereto.

Figure 2:
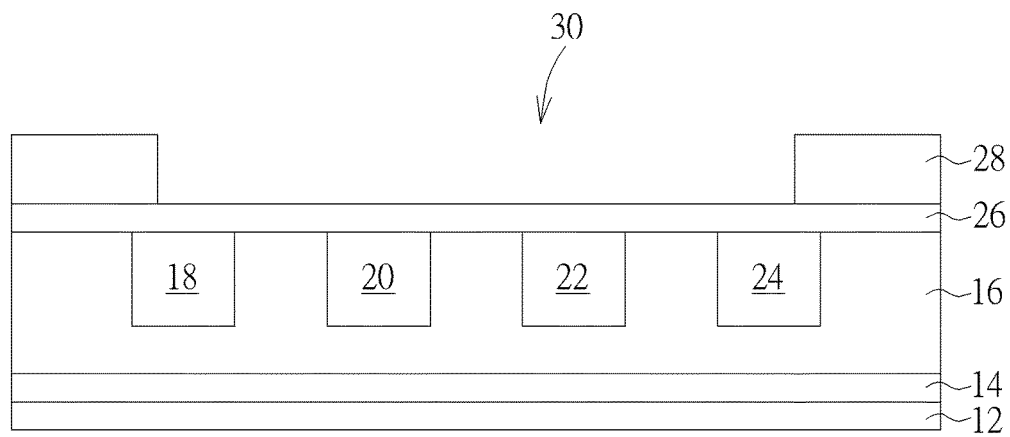

Next, as shown in FIG. 2, a patterned mask such as a patterned resist 28 is formed on the first cap layer 26, in which the patterned resist 28 includes an opening 30 exposing part of the surface of the first cap layer 26.

Figure 3:
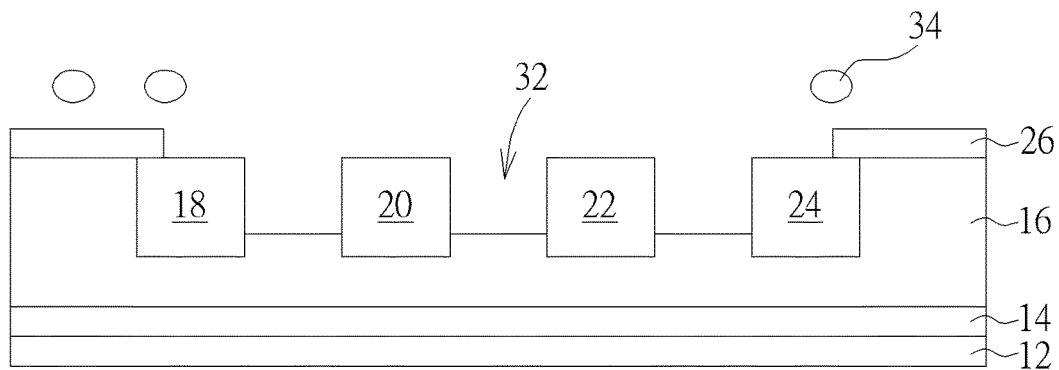

Next, as shown in FIG. 3, an etching process is conducted by using the patterned resist 28 as mask to remove part of the first cap layer 26 and part of the first IMD layer 16 to form recess 32 exposing top surfaces and sidewalls of the metal interconnections 18, 20, 22, 24. In this embodiment, the etching process conducted at this stage preferably includes a dry etching process and polymers 34 could be remained the surface of the first cap layer 26 after the recess 32 is formed.

It should be noted that the gas used in the dry etching process is preferably selected from the group consisting of nitrogen gas ($N_2$) and hydrogen gas ($H_2$), in which the flow of nitrogen gas is preferably between 270-330 standard cubic centimeter per minute (sccm) and the flow of hydrogen gas is between 720-880 sccm. Typically, corners of metal interconnections 18, 20, 22, 24 could be over etched when the flow rate between etching gases such as $N_2$ and $H_2$ is not controlled under desirable ratio during the aforementioned dry etching process, which could then affect the size and the position of the air gaps formed afterwards. In order to resolve this issue, the present invention preferably adjusts the flow rate between etching gases such as $N_2$ and $H_2$ according to the aforementioned range so that no corner rounding would result on the metal interconnections 18, 20, 22, 24 during the dry etching process for forming the recess 32.

Figure 4:
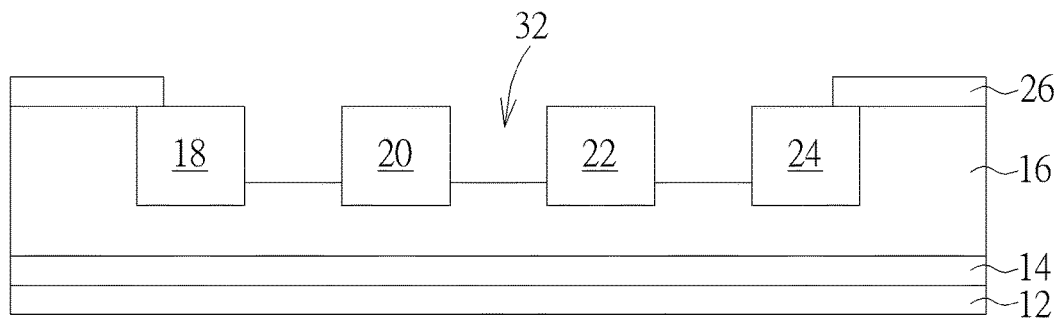

Next, as shown in FIG. 4, another etching process such as a wet etching process is conducted to remove the remaining polymers 34 on the first cap layer 26.

Figure 5:
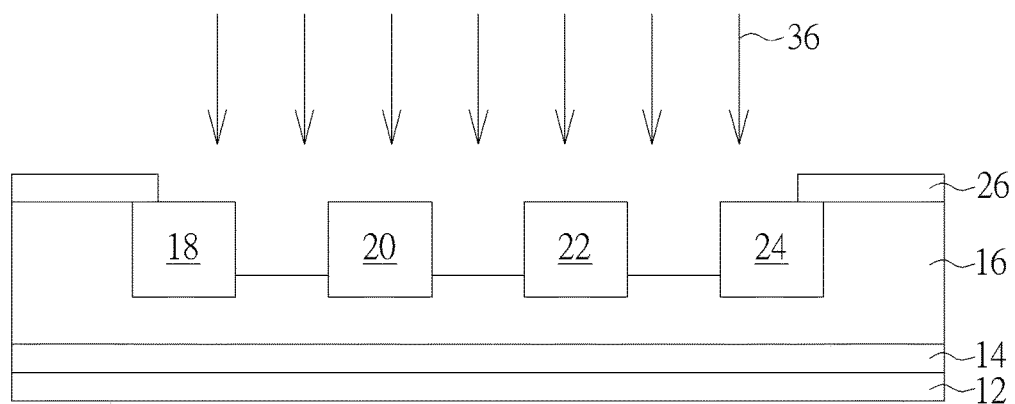

Next, as shown in FIG. 5, a curing process 36 is conducted after the wet etching process to improve the strengths of the first cap layer 26 and even the first IMD layer 16. Typically, when electrical field applied onto a dielectric material exceeds a threshold value, a sudden increase in the electrical current passing through the dielectric material would easily induce a time-dependent dielectric breakdown (TDDB) issue. In order to reduce this phenomenon, the present invention conducts the aforementioned curing process to increase the strength of the deposited dielectric materials so that TDDB could be minimized. In this embodiment, the curing process preferably includes a ultraviolet (UV) curing process and the temperature of the curing process is preferably between 347° C. to 424° C. and most preferably at 385° C.

Figure 6:
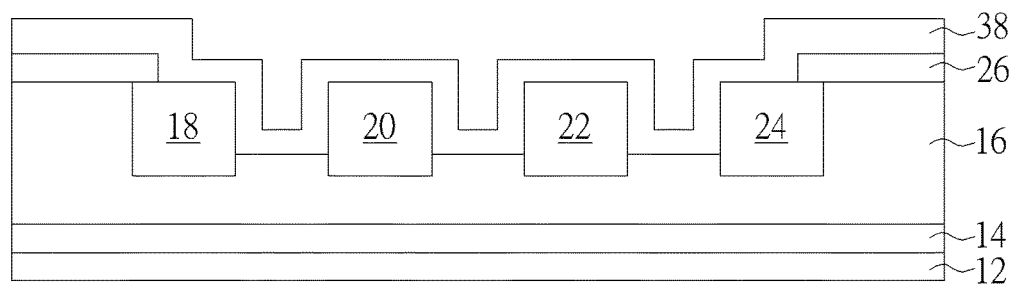

Next, as shown in FIG. 6, a second cap layer 38 is formed on the first cap layer 26 and the metal interconnections 18, 20, 22, 24 and filled into the recess 32 between metal interconnections 18, 20, 22, 24 without filling the recess 32 completely. Preferably, the top surface of the second cap layer 38 contacting the metal interconnections 18, 20, 22, 24 is slightly lower than the top surface of the first cap layer 26 in this embodiment, according to other embodiments of the present invention, the top surface of the second cap layer 38 directly contacting the metal interconnections 18, 20, 22, 24 could also be even with or higher than the top surface of the first cap layer 26, which are all within the scope of the present invention. In this embodiment, the first cap layer 26 and the second cap layer 38 could be made of same material or different material depending on the demand of the product. If the two layers 26 and 38 were to be made of same material, the first cap layer 26 and the second cap layer 38 are preferably made of nitrogen doped carbide (NDC), and if the two layers 26 and 38 were made of different material, the first cap layer 26 preferably includes NDC while the second cap layer 38 is preferably made of metal nitrides such as aluminum nitride (AlN).

Figure 7:
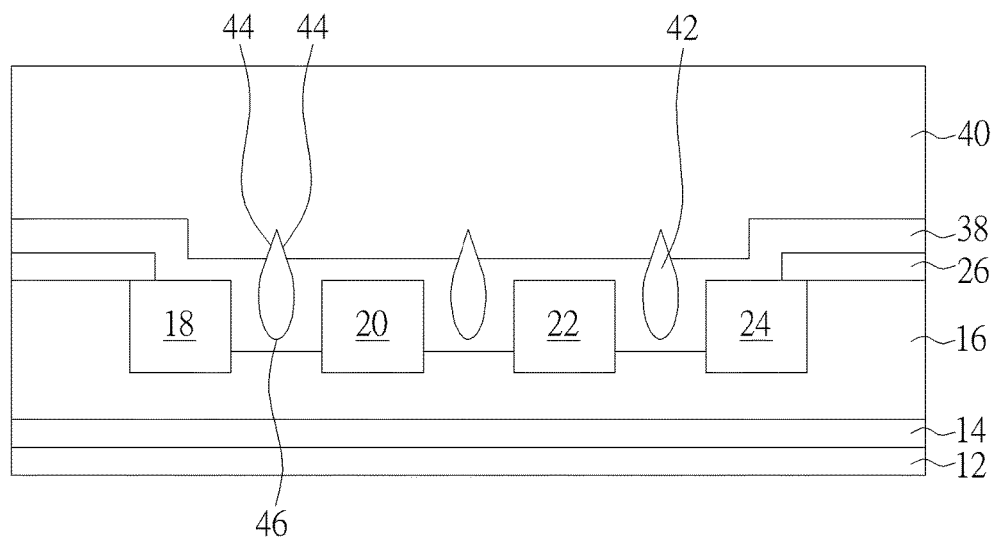

Next, as shown in FIG. 7, a second IMD layer 40 is formed on the second cap layer 38 while forming air gaps 42 between the metal interconnections 18, 20, 22, 24 at the same time. Specifically, each of the air gaps 42 is surrounded by the second cap layer 38 and the second IMD layer 40 and the topmost tip or vertex of each air gap 42 is higher than the top surface of the metal interconnections 18, 20, 22, 24. In this embodiment, each of the air gaps 42 resembles the shape of a water droplet, in which the top portion of each air gap 42 includes two planar and inclined sidewalls 44 while the bottom portion of the air gap 42 includes a curved bottom surface 46. Preferably, the topmost tip or vertex of each air gap 42 is higher than the top surfaces of the first IMD layer 16, the metal interconnections 18, 20, 22, 24, the first cap layer 26, and the top surface of second cap layer 38 situating directly on top of the metal interconnections 18, 20, 22, 24, and slightly lower than the top surface of the second cap layer 38 situating directly on top of the first cap layer 26. The curved bottom surface 46 or more specifically the bottommost tip of each air gap 42 is preferably lower than half the height of each of the metal interconnections 18, 20, 22, 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising: providing a substrate having a first inter-metal dielectric (IMD) layer thereon; forming a first metal interconnection and a second metal interconnection in the first IMD layer; forming a first cap layer on the first IMD layer, the first metal interconnection, and the second metal interconnection; performing an etching process to remove part of the first cap layer and part of the first IMD layer to form a recess between the first metal interconnection and the second metal interconnection; performing a curing process after removing part of the first IMD layer to form the recess; forming a second cap layer on the first metal interconnection and the second metal interconnection; and forming a second IMD layer after performing the curing process on the first metal interconnection, the second metal interconnection, and the second cap layer while forming an air gap; forming the air gap to have a bottom surface in direct contact with the second cap layer.

2. The method of claim 1, wherein the first cap layer and the second cap layer comprise same material.

3. The method of claim 2, wherein the first cap layer and the second cap layer comprise nitrogen doped carbide (NDC).

4. The method of claim 1, wherein the first cap layer and the second cap layer comprise different material.

5. The method of claim 4, wherein the first cap layer comprises nitrogen doped carbide (NDC) and the second cap layer comprises metal nitride.

6. The method of claim 1, wherein the air gap is enclosed by the second cap layer and the second IMD layer.

7. The method of claim 1, wherein a vertex of the air gap is higher than a top surface of the first metal interconnection.

8. The method of claim 1, wherein the top surfaces of the first metal interconnection and the first IMD layer are coplanar.

9. The method of claim 1, wherein a temperature of the curing process is between 347° C. to 424° C.

10. A semiconductor device, comprising:
- a substrate having a first inter-metal dielectric (IMD) layer thereon;
- a first metal interconnection and a second metal interconnection in the first IMD layer;
- a first cap layer on the first IMD layer;
- a second cap layer on the first metal interconnection and the second metal interconnection;
- a second IMD layer on the second cap layer; and
- an air gap between the first metal interconnection and the second metal interconnection, and the air gap is located within each of the second IMD layer and the second cap layer, wherein the air gap extends from the second cap layer into the second IMD layer, wherein a vertex of the air gap is higher than a top surface of the first metal interconnection and a bottom surface of the air gap contacts the second cap layer directly.

11. The semiconductor device of claim 10, wherein the first cap layer and the second cap layer comprise same material.

12. The semiconductor device of claim 11, wherein the first cap layer and the second cap layer comprise nitrogen doped carbide (NDC).

13. The semiconductor device of claim 10, wherein the first cap layer and the second cap layer comprise different material.

14. The semiconductor device of claim 13, wherein the first cap layer comprises nitrogen doped carbide (NDC) and the second cap layer comprises metal nitride.

15. The semiconductor device of claim 10, wherein a bottom surface of the air gap is lower than half the height of the first metal interconnection.

16. The semiconductor device of claim 10, wherein the top surfaces of the first metal interconnection and the first IMD layer are coplanar.

* * * * *